US010735123B2

(12) United States Patent
Cao et al.

(10) Patent No.: US 10,735,123 B2
(45) Date of Patent: Aug. 4, 2020

(54) UNIVERSAL PSEUDORANDOM NOISE CODE GENERATOR

(71) Applicant: Honeywell International Inc., Morris Plains, NJ (US)

(72) Inventors: Xiao Cao, Shanghai (CN); Yunlong Huang, Shanghai (CN)

(73) Assignee: Honeywell International Inc., Morris Plains, NJ (US)

( * ) Notice: Subject to any disclaimer, the term of this patent is extended or adjusted under 35 U.S.C. 154(b) by 184 days.

(21) Appl. No.: 16/057,525

(22) Filed: Aug. 7, 2018

(65) Prior Publication Data

US 2020/0052806 A1 Feb. 13, 2020

(51) Int. Cl.
*G06F 21/00* (2013.01)
*H04J 13/10* (2011.01)
(Continued)

(52) U.S. Cl.
CPC ............ *H04J 13/102* (2013.01); *H03K 19/21* (2013.01); *H04J 13/0029* (2013.01); *H04J 13/0074* (2013.01)

(58) Field of Classification Search
CPC .. H04J 13/102; H04J 13/0029; H04J 13/0074; H03K 19/21
See application file for complete search history.

(56) References Cited

U.S. PATENT DOCUMENTS 8,675,712 B1 * 3/2014 Jin ........................ G01S 19/30
375/140

2007/0058591 A1 * 3/2007 Lamance ................. G01S 5/14
370/335
(Continued)

FOREIGN PATENT DOCUMENTS

| CN | 102073053 B | 10/2012 |
|---|---|---|
| CN | 103487817 B | 11/2015 |

(Continued)

OTHER PUBLICATIONS

China Satellite Navigation Office, "BeiDou Navigation Satellite System Signal In Space Interface Control Document Open Service Signal B2a (Version 1.0)", Published: Dec. 2017, pp. 1-81.
(Continued)

*Primary Examiner* — Jeffrey C Pwu
*Assistant Examiner* — William A Corum, Jr.
(74) *Attorney, Agent, or Firm* — Fogg & Powers LLC

(57) ABSTRACT

A pseudo-random noise (PRN) code generator is provided. The PRN code generator includes a register controller; a digitally controlled oscillator (DCO); a primary code generator configured to generate a primary code chip; and a secondary code generator configured to generate a secondary code chip. The primary code generator and the secondary code generator each include: a Weil code generator configured to generate a Weil code chip; a memory code generator configured to generate a memory code chip; a Golden code generator configured to generate a Golden code chip; and a first multiplexer configured to select the Weil code chip, the Golden code chip, or the memory code chip as the primary code chip or the secondary code chip. The PRN code generator also includes a first XOR gate configured to XOR the primary code chip and the secondary code chip to generate a PRN code chip.

20 Claims, 9 Drawing Sheets

(51) Int. Cl.
*H03K 19/21* (2006.01)
*H04J 13/00* (2011.01)

(56) References Cited

U.S. PATENT DOCUMENTS

| | | | |
|---|---|---|---|
| 2011/0068958 A1 | 3/2011 | Knight et al. | |
| 2014/0354473 A1* | 12/2014 | Wallner | G01S 19/01 342/357.51 |
| 2017/0108588 A1* | 4/2017 | Wei | G01S 19/30 |

FOREIGN PATENT DOCUMENTS

| | | | | |
|---|---|---|---|---|
| EP | 1102415 A2 * | 5/2001 | ........... | H04B 1/7085 |
| EP | 2051092 A1 * | 4/2009 | ............. | G01S 19/37 |
| EP | 2021818 B1 * | 10/2011 | ............. | G01S 19/30 |

OTHER PUBLICATIONS

China Satellite Navigation Office, "BeiDou Navigation Satellite System Signal In Space Interface Control Document Open Service Signal B1C (Version 1.0)", Published: Dec. 2017, pp. 1-87.
European Union, "European GNSS (Galileo) Open Service Signal-In-Space Interface Control Document", Galileo Navigation Solutions Powered by Europe, Published: Dec. 2016, pp. 1-88, Issue 1.3.
Global Positioning Systems Directorate, "Global Positioning Systems Directorate Systems Engineering & Integration Interface Specification IS-GPS-200 Navstar GPS Space Segment/Navigation User Interfaces" Sep. 24, 2013, pp. 1-226.
Global Positioning Systems Directorate, "Global Positioning Systems Directorate Systems Engineering & Integration Interface Specification IS-GPS-800 Navstar GPS Space Segment/User Segment L1C Interface" Sep. 24, 2013, pp. 1-127.
Global Positioning Systems Directorate, "Global Positioning Systems Directorate Systems Engineering & Integration Interface Specification IS-GPS-705 Navstar GPS Space Segment/User Segment L5 Interface" Sep. 24, 2013, pp. 1-104.
Russian Institute of Space Device Engineering, "Global Navigation Sattelite System GLONASS Interface Control Document Navigational radiosignal In bands L1, L2 (Edition 5.1)" Published Moscow, 2008, pp. 1-63.
Russian Rocket and Space Engineering and Information Systems Corporation, Joint Stock Company, "Global Navigation Satellite System GLONASS Interface Control Document General Description of Code Division Multiple Access Signal System Edition 1.0", Published: Moscow, pp. 1-119.
Sisira C.S et al., Code Generation for Different Navigation Systems, International Journal Engineering Trends and Technology (IJETT), Jun. 2015, pp. 5-8, vol. 24 No. 1, Publisher: www.ijettjournal.org.

* cited by examiner

UNIVERSAL PSEUDORANDOM NOISE CODE GENERATOR

BACKGROUND

At present, there are at least four global navigation satellite systems (GNSS) in use around the world. It would be beneficial and advantageous for a GNSS receiver to be compatible with multiple (or all) of the currently-used global navigation satellite systems.

SUMMARY

A pseudo-random noise (PRN) code generator is provided. The PRN code generator includes a register controller configured to interface with an external system that sets code information and phase control, wherein the register controller also stores a current internal code status. The PRN code generator also includes a digitally controlled oscillator (DCO) configured to receive the phase control and generate a code clock, a code chip index, and a code phase. The PRN code generator also includes a primary code generator configured to generate a primary code chip and a secondary code generator configured to generate a secondary code chip. The primary code generator and the secondary code generator each include: a Weil code generator configured to generate a Weil code chip; a memory code generator configured to generate a memory code chip; a Golden code generator configured to generate a Golden code chip; and a first multiplexer configured to select the Weil code chip, the Golden code chip, or the memory code chip as the primary code chip or the secondary code chip. The PRN code generator also includes a first XOR gate configured to XOR the primary code chip and the secondary code chip to generate a PRN code chip.

BRIEF DESCRIPTION OF THE DRAWINGS

Embodiments of the present invention can be more easily understood and further advantages and uses thereof more readily apparent, when considered in view of the description of the preferred embodiments and the following figures in which.

DETAILED DESCRIPTION

Figure 1:
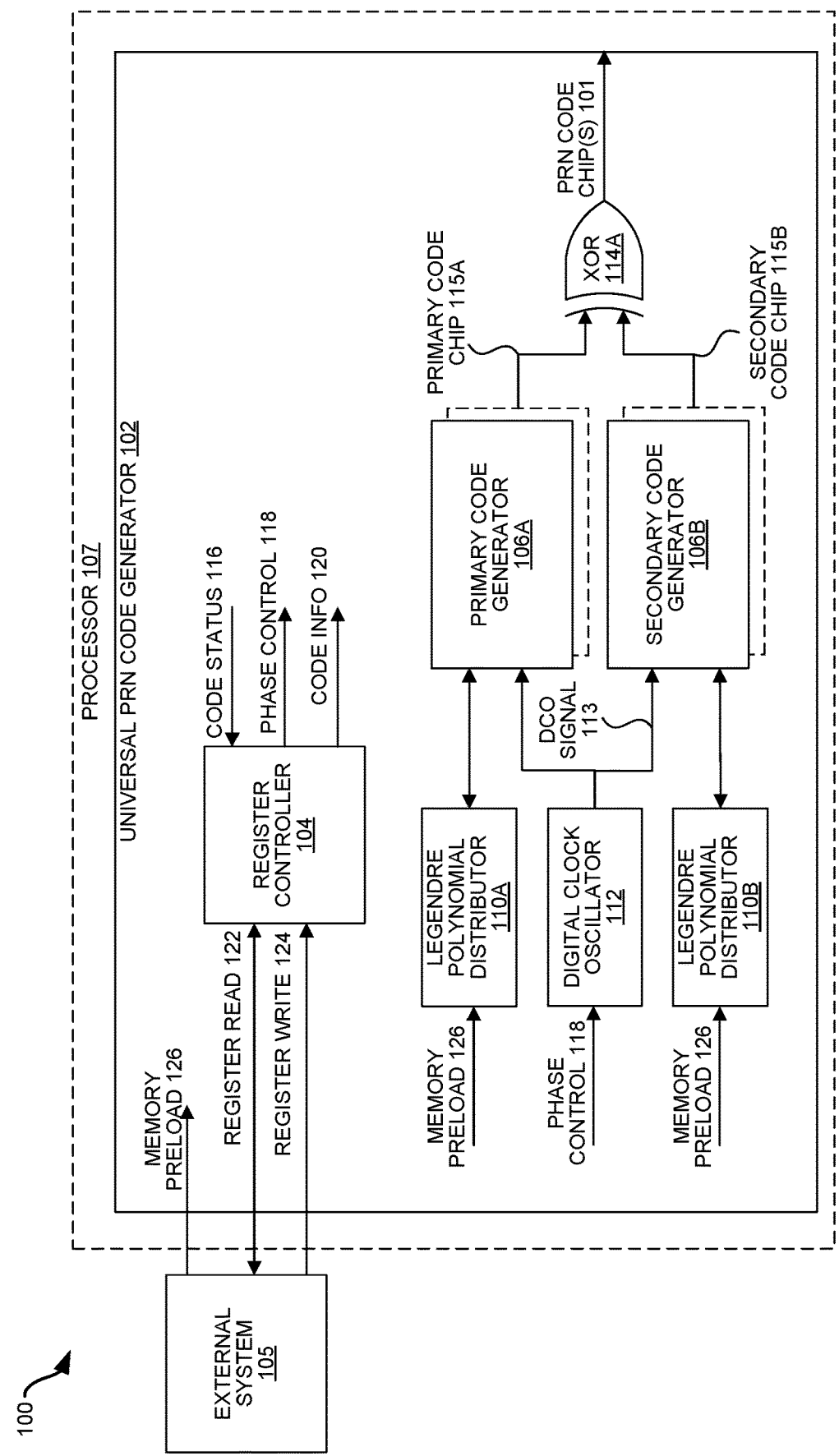
FIG. 1 is a block diagram illustrating an example universal PRN code generator.

In the following detailed description, reference is made to the accompanying drawings that form a part hereof, and in which is shown by way of specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

Several different global navigation satellite systems (GNSS) are used around the world, including the Global Positioning System (GPS), Global Navigation Satellite System (GLONASS), BeiDou Navigation Satellite System (BDS), and the Galileo system. In each satellite constellation, multiple frequencies are used. In each frequency, multiple modulations are used. In each modulation, there are multiple signals. In each signal, there is a group of Pseudo-Random Noise (PRN) codes, which is different for different satellites. This access system is referred to as Code Division Multiple Access (CDMA).

For example, GPS has 3 frequencies: L1, L2, and L5. GPS L1 includes 2 modulations: QPSK and MBOC. GPS L1 MBOC includes 2 signals: L1C_d and L1C_p, GPS L1C_data signal includes 63 PRN codes, which are 1.023 Mbps and whose primary code lengths are 10230 each. Considering the civil (i.e., non-military) signals alone, there are a dozen of signals in all 4 constellations, which have different code generation types and each type includes dozens of different PRN codes.

Accordingly, the present systems and methods describe a universal PRN code generator, which can generate all known GNSS PRN codes used in civil (i.e., non-military) satellite navigation systems. For example, the universal PRN code generator can support the following non-memory codes: GPS L1 C/A, L1C_d, L1C_p, L2CM, L2CL, L5C_I, GLONASS G1 C/A, G2 C/A, L1OC_d, L1 OC_p, L2OC_p, L3OC_d, L3OC_p, BeiDou B1I, B2I, B3I, B1C, B2a, Galileo E5a_I, E5a_Q, and memory codes: E1b, E1c by using an optional memory storage preload. All PRN codes include Primary code and secondary code. Furthermore, the universal PRN code generator described herein may support potential PRN codes in future satellite navigation systems, i.e., the universal PRN code generator may be flexibly configured.

The universal PRN code generator described herein may include a system controller, configuration storage and decoder, 14-step shifting registers (e.g., LFSRs) and/or multiplexers. The system controller may load input parameters, including signal type and PRN number, send them to configuration, and decode them into various parameters (e.g., initial phase, code phase, etc.) that are used to generate the code. Then, the system controller may load all the decoded parameters into a universal channel and assign. The universal PRN code generator may work for specific PRN code generation and generate code as global clock based on necessary code rate.

In one configuration, the universal PRN code generator described herein generates (in real-time) all known civil (i.e., non-military) PRN codes for all navigation satellite systems with only signal type ID input. Such a configuration may greatly reduce the complexity of multi-frequency, multi-constellation receiver design compared to conventional techniques of PRN code generation across multiple navigation satellite systems.

It may be convenient to implement the universal PRN code generator in a single FPGA or ASIC module. The module's input may include code info (e.g., constellation, frequency and code type, PRN ID), and code phase control info (code chip rate, code phase). Then the module may generate specific PRN code as the output, following a global clock.

FIG. 1 is a block diagram illustrating an example universal PRN code generator 102. Optionally, the universal PRN code generator 102 may be implemented (or partially implemented) using one or more processors 107, e.g., one or more Field Programmable Gate Arrays (FPGAs) and/or one or more application specific integrated circuits (ASICs).

The universal PRN code generator 102 may generate a series of PRN code chips 101, which together form a pseudo-random noise (PRN) code, i.e., a cyclical, quasi-random sequence of bits that are deterministically generated. The PRN code may be based on a Golden-like code (i.e., a code that shares the same code generation structure as a Golden code, but may not entirely meet the Golden code standard), a Weil code, or a memory code. The terms "chip" and "bit" are used interchangeably herein to refer to a binary unit of data.

The universal PRN code generator 102 may reside in an electronic device 100 (e.g., a satellite receiver) that also includes an external system 105, i.e., one or more modules external to the universal PRN code generator 102, but located in the same electronic device 100 as the universal PRN code generator 102. Although illustrated as not being in the optional processor 107, the external system 105 may alternatively be included (or partially included) on the same optional processor 107 as the universal PRN code generator 102.

The generated PRN code may be time-aligned with a PRN code received from a satellite to determine the distance from the electronic device 100 to the satellite. The electronic device 100 (e.g., a satellite receiver) may determine the distance from multiple satellites in order to determine an absolute position of the electronic device 100 (e.g., satellite receiver) on the earth.

The universal PRN code generator 102 may be compatible with one or more of: the Global Positioning System (GPS), the Global Navigation Satellite System (GLONASS), the BeiDou Navigation Satellite System (BDS), and the Galileo system. For example, the universal PRN code generator 102 may be compatible with GPS, GLONASS, BDS, and Galileo systems.

The universal PRN code generator 102 may include a register controller (RC) 104, a primary code generator 106A, a secondary code generator 106B, one or more Legendre polynomial distributor (LPD) 110A-B, and a code digitally controlled oscillator (DCO) 112. Although illustrated as separate modules, the Legendre polynomial distributors (LPDs) 110 may be implemented in a single module. Additionally, the primary code generator 106A and the secondary code generator 106B may be identical in structure and/or function.

Each of the at least one primary code generator 106A and at least one secondary code generator 106B may include a Weil code generator, a memory code generator, and a Golden code generator that are configured to generate Weil code chips, memory code chips, and Golden code chips, respectively, depending on a selected code type (included in the code info 120). The primary code generator 106A and the secondary code generator 106B may be configured to generate a primary code chip 115A and a secondary code chip 115B, respectively, e.g., every code clock cycle.

The DCO 112 may be configured to generate a DCO signal 113. At any system clock epoch, a user may want to know the code chip and code phase (included in the DCO signal 113), which may be used to measure the distance between transmitter and receiver, i.e., distance=code difference x light speed. The DCO 112 may receive a phase control 118 signal (from the register controller 104) and generate the DCO signal 113 that includes a code clock. The DCO 112 may control the code chip rate and code phase of the at least one primary code generator 106A and the at least one secondary code generator 106B.

Specifically, the DCO 112 may be a digital differential analyzer (DDA). In this example, the current accumulator value may be the code phase and the overflow signal may be the code clock. Two additional counters of the code clock may produce current primary/secondary code chip. The external system 105 may (1) adjust the chip rate by setting the integrator step; (2) adjust the code phase by adding or subtracting the value of the accumulator; and (3) adjust code chip index by changing the counters' value.

The Legendre polynomial distributor(s) 110A-B may be configured to store a Legendre polynomial, i.e., so that the Weil code generators (in the primary code generator 106A and secondary code generator 106B) can acquire the Legendre bit per its code chip index. Specifically, the LPD 110 may utilize a lookup table in order to serve the one or more primary code generators 106A and the one or more secondary code generators 106B. The one or more primary code generators 106A and the one or more secondary code generators 106B may send Legendre code requests to the LPD 110 and, in response, receive one Legendre code response bit from the LPD 110. The LPD 110 may feed several code generators 106 by polling all requests and sending response bits with channel information. Since the LPD 110 may receive many input requests and output a single output response at a time, the channel information may be the currently polled channel number.

The register controller 104 may interface with the external system 105. The external system 105 may set the code information 120 and the phase control 118. The register controller 104 may work as a bus slave. The external system 105 may access a series of registers through a register read signal 122 and a register write signal 124. The register controller 104 may include and/or manage three kinds of registers: code status 116, phase control 118, and code info 120.

One or more of the registers may be loaded during a memory preload 126, e.g., a one-time load of data. The memory preload 126 may include loading two kinds of code into the universal PRN code generator 102. First, one or more irregular code sequences, such as a Galileo E1 PRN code (e.g., as defined in Galileo interface control document (ICD)) may be loaded into a memory code generator (discussed below). The memory code generator may also store other PRN codes in the future, making the universal PRN code generator 102 adaptable going forward. Second, the memory preload 126 may also include loading Legendre bit sequences into the Legendre polynomial distributor 110, which are used to generate Weil code, e.g., as defined in the GNSS interface control document.

As used herein, the registers, the data stored in the register, and the signal conveying the data stored in the register may be referred to interchangeably. For example, the term "phase control 118" may refer to one or more phase control register(s), data stored in the phase control register(s), and/or a signal conveying the data stored in the phase control register(s), e.g., to the DCO 112.

When the PRN code generator 102 begins to work, it may generate a code sequence one PRN code chip 101 at a time, i.e., one bit at a time. After one code cycle (such as 1023 bits for GPS L1), the universal PRN code generator 102 may be reset and restart from the beginning. The code status 116 may indicate the code chip index and code phase (the decimal parts of code chip) in real-time, as the code sequence is output.

For example, if the system clock is 50 MHz, the PRN code rate is 1.023 Mbps, and if the PRN code length is 1023 bits, the code cycle will be 1 ms. In this example, at each $1/(1.023 \times 10^6)$ second epoch, the universal PRN code generator 102 may generate one PRN code chip 101 (i.e., an exclusive OR (XOR) gate 114A may XOR the primary code chip 115A and the secondary code chip 115B) and a code chip counter will increment by one. Furthermore, at each $1/(50 \times 10^6)$ second epoch (most of the time), the code chip counter will remain its previous value, but the code phase will add a related value. Specifically, if a 32-bit accumulator is used for the DCO 112, every $1/(50 \times 10^6)$ second, $(1.023 \times 10^6/50 \times 10^6)*2^{\wedge}32$ is added in the accumulator. When the accumulated value exceeds $2^{\wedge}32$, the accumulator will overflow, one PRN code chip 101 is enabled, and the code chip counter is incremented by one, while every $1/(50 \times 10^6)$ seconds, the code phase will be assigned to the accumulated value in the DCO accumulator (MOD $2^{\wedge}32$), i.e., the code phase is the decimal part of the code chip (e.g., the decimal part of the PRN code chip 101 that is output).

The phase control 118 may be used to set up the chip rate and adjust the code phase and the code chip index. The chip rate is the PRN code rate, i.e., number of PRN code chips 101 produced per second. For example, the chip rate may be 1.023 Mbps for GPS L1 C/A code. If a desired output code bit is 100 bits earlier than current code bit, a related value can be set from 0 to 100. Then, the universal PRN code generator 102 may generate the PRN code chip 101 that is 100 bits earlier than the current PRN code chip 101.

The code info 120 may include a code type that is used to select between various code generators within the at least one code generator 106A and the at least one secondary code generator 106B, e.g., a Weil code generator, a memory code generator, and a Golden code generator. The code info 120 may also include the code length. The code length indicates the length of the code being generated, after which the universal PRN code generator 102 will reset and restart from the beginning, i.e., if the code chip counter reaches the code length (e.g., 1023), the universal PRN code generator 102 will be reset.

The code info 120 may also include code-type-specific code parameters, which includes various PRN code description messages according to relevant interface control documents (i.e., technical specifications) for a particular satellite navigation system. For example, the code info 120 may include code parameters specific to Golden code, e.g., LFSR length, polynomial of the Golden code. The LFSR length (different from code length) may be defined in an interface control document (ICD) and may be used by a Golden code generator (inside the at least one primary code generator 106A and the at least one secondary code generator 106B) to generate a sequence of PRN code chips 101. The polynomial may be the mathematical expression of a code shifter register (e.g., the LFSRs) and may be used to generate a sequence of PRN code chips 101. For example, the polynomial(s) (e.g., for BeiDou B2A primary code) may be $g_1(x)=1+x+x^5+x^{11}+x^{13}$; and $g_2(x)=1+x^3+x^5+x^9+x^{11}+x^{12}+x^{13}$.

The code info 120 may also include code parameters specific to Weil code, e.g., Weil code phase difference, truncation point, w value for Weil code, p value for Weil code. The Weil code phase difference may be used to generate a PRN code sequence, i.e., Weil code may be generated by XORing two Legendre bit sequences, which have a specific code phase difference. The truncation point may be defined in the GNSS interface control document (ICD) for GNSS. For a BeiDou B1C signal, the Legendre bit sequence may be truncated at the 8,190th bit, then back to the 1st bit, which is involved in the XOR calculation. The w value for Weil code may be the index difference between two Legendre bit sequences. The p value may be a common 7-bit expansion sequence (for GPS L1C), or the position where a Weil code is truncated (in BeiDou).

Figure 2:
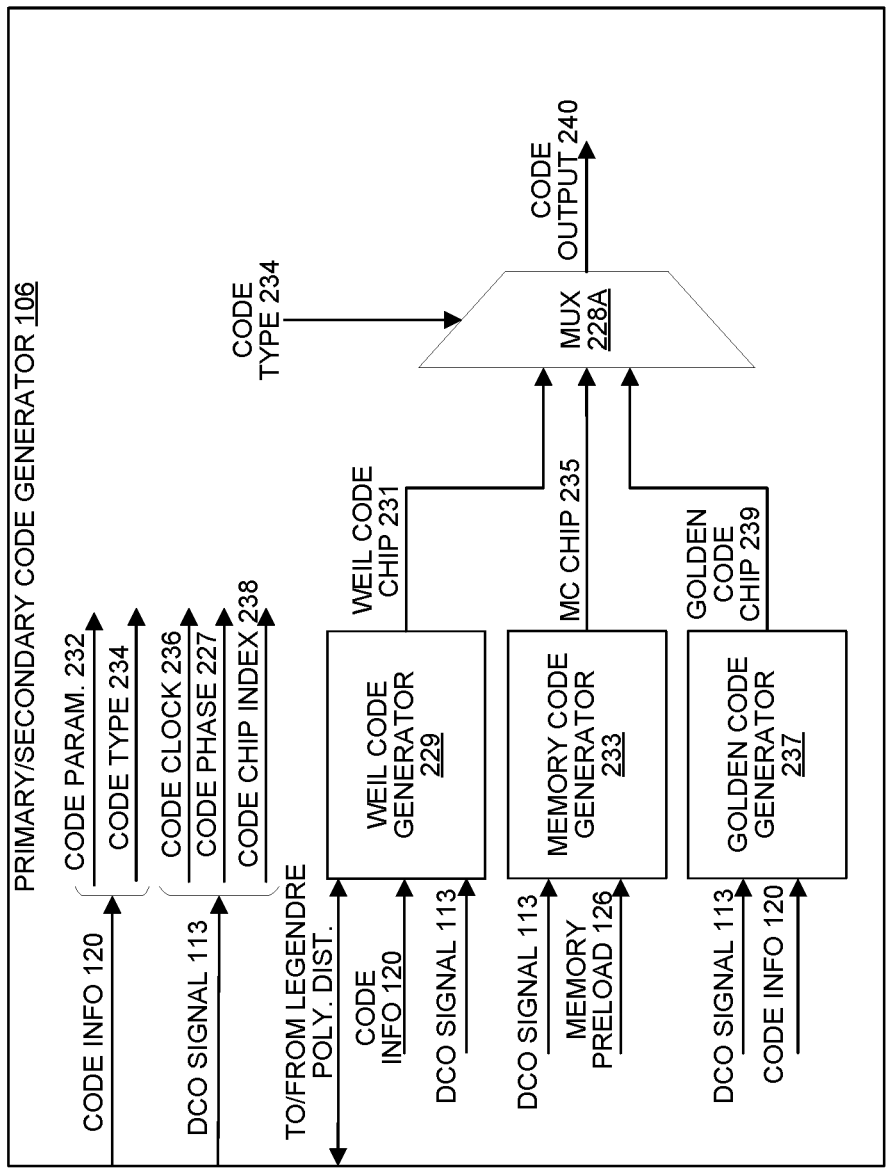
FIG. 2 is a block diagram illustrating an example primary/secondary code generator.

FIG. 2 is a block diagram illustrating an example primary/secondary code generator 106. As described above, the at least one primary code generator 106A and the at least one secondary code generator 106B may be identical in structure and/or function. Accordingly, a universal PRN code generator 102 may include at least two instances of the primary/secondary code generator 106 illustrated in FIG. 2.

The primary/secondary code generator 106 may include a Weil code generator (WCG) 229, a memory code generator (MCG) 233, and a Golden code generator (GCG) 237. The Weil code generator 229 may be configured to generate a Weil code chip 231 using a Legendre polynomial bit (i.e., from the Legendre polynomial distributor 110); the code clock 236, the code phase 227, and the code chip index 238 from the DCO 112 (i.e., as part of the DCO signal 113); and the code information 120 from the register controller 104. The Weil code generator 229 may generate a Weil code chip 231, e.g., once every code clock 236.

The memory code generator 233 may be configured to generate other kinds of codes, including memory codes (MC) of Galileo signals (e.g., Galileo E1 PRN code as defined in the Galileo interface control document) and Neuman-Hofman (NH) code for L5 signals. If the code type 234 is memory code, the external system 105 may write memory code to the memory code generator 233 via a memory preload port 126. The memory code generator 233 may generate a memory code chip 235, e.g., once every code clock 236.

The Golden code generator 237 may be configured to generate a Golden code chip 239 based on linear feedback shift register (LFSR) parameters (as part of the code parameters 232 in the code info 120), including L1, L5, B2a, etc. The Golden code generator 237 may also receive the code clock 236, the code phase 227, and the code chip index 238 from the DCO 112 (as part of the DCO signal 113) and the code information 120 (including the code parameters 232) from the register controller 104. The Golden code generator 237 may generate a Golden code chip 239, e.g., once every code clock 236.

A multiplexer 228A (MUX) may be used to select which code to generate. In other words, a Weil code chip 231, a memory code chip 235, or a Golden code chip 239 is selected as the code output 240 depending on the code type 234 from the register controller 104.

Figure 3:
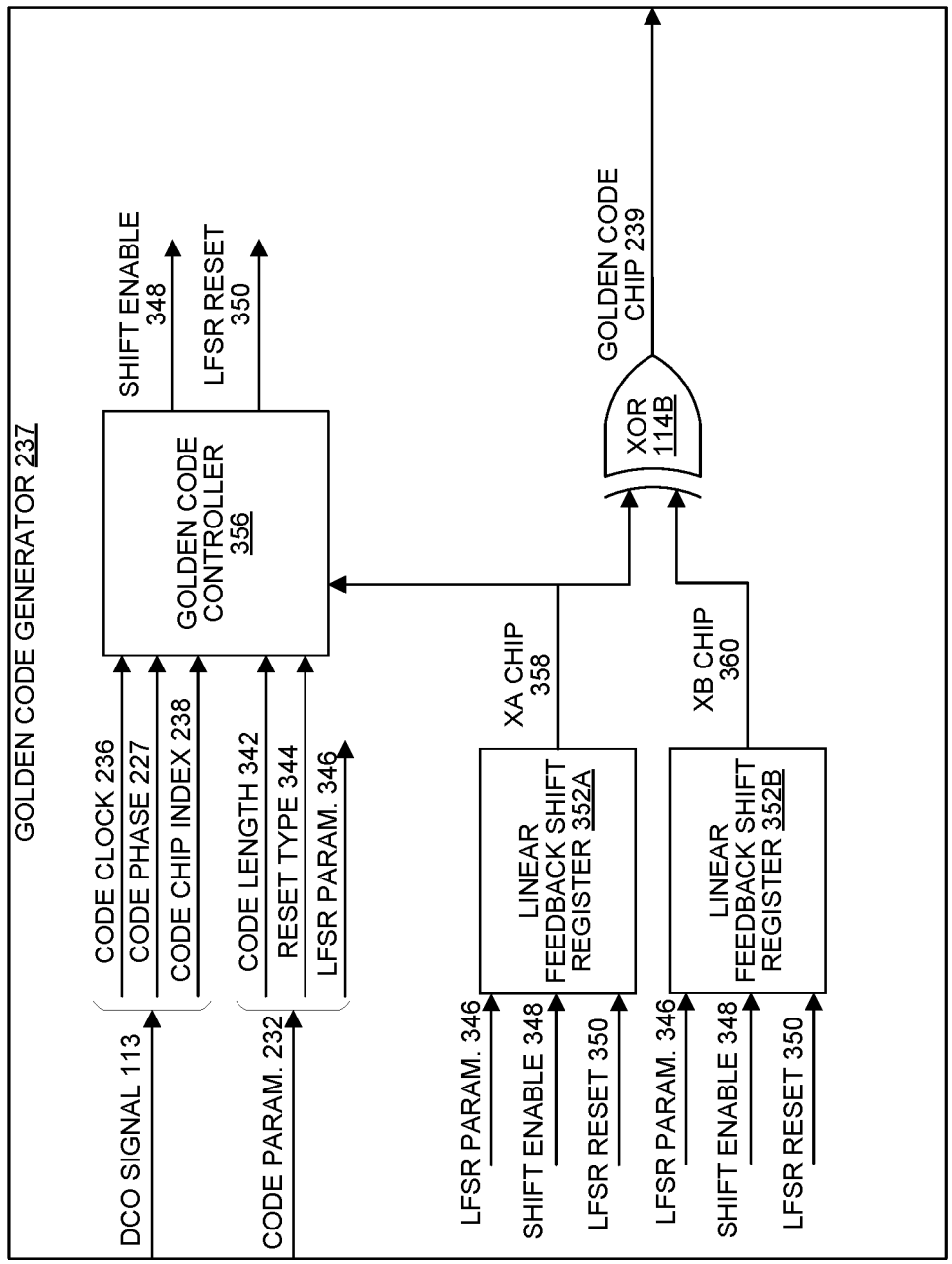
FIG. 3 is a block diagram illustrating an example Golden code generator.

FIG. 3 is a block diagram illustrating an example Golden code generator 237. The Golden code generator 237 may be included in a primary code generator 106A and/or a secondary code generator 106B in a universal PRN code generator 102.

The Golden code generator 237 may receive the code clock 236, the code phase 227, and the code chip index 238 (as part of the DCO signal 113 from the DCO 112) and the code parameters 232 (e.g., as part of the code info 120) as inputs. Based on the inputs, the Golden code generator 237 may generate a series of Golden code chips 239 (e.g., a Golden code chip 239 per code clock 236), which together form a Golden code.

Specifically, the Golden code generator 237 may generate a Golden code chip 239 using two linear feedback shift registers (LFSR) 352A-B and a Golden code controller 356. An LFSR 352 is a shift register whose input bit is a linear function of its previous state. Each LFSR 352 may have three configurable LFSR parameters 346: register initial value, LFSR length, and polynomial. The LFSR length parameter may indicate the length of the LFSR 352. The initial value parameter may be the value that the LFSRs are set to before shifting to generate the Golden code chip(s) 239, e.g., 0 or 1. The polynomial parameter may be a mathematical expression of the LFSR. The LFSR parameters 346 (i.e., register initial value, LFSR length, and polynomial) may be included in the code parameters 232 (in the code info 120 from the register controller 104). Thus, the Golden code generator 237 may generate different kinds of Golden codes by setting these parameters.

The LFSRs 352 may each have two control ports, shift enable 348 and LFSR reset 350. When the shift enable 348 is active, the LFSRs 352 may shift one bit. When the LFSR reset 350 is active, the registers (e.g., LFSRs 352) may reset to the initial value. The LFSRs 352 may receive the control signals from the Golden code controller 356. Based on the shift enable 348, the LFSR reset 350 and the LFSR parameters 346 (i.e., the register initial value, LFSR length, and polynomial), each LFSR 352 may generate a chip, i.e., the first LFSR 352A may produce an XA chip 358, and the second LFSR 352B may produce an XB chip 360 output signal. An XOR gate 114B may XOR the XA chip 358 and the XB chip 360 to produce a Golden code chip 239.

The Golden code controller 356 may receive the DCO signal 113 and at least some of the code parameters 232 (e.g., as part of the code info 120) as inputs. Specifically, the Golden code controller 356 may be configured to generate the shift enable 348 signal and the LFSR reset signal 350 using at least the code clock 236, the code phase 227, and the code chip index 238 from the DCO 112. The Golden code controller may also receive the code length 342 and the reset type 344 (in the code parameters 232) as inputs. The Golden code controller 356 may also receive the XA chip 358 from the first LFSR 352A.

In one configuration, set the length of the LFSRs 352, the initial value of the LFSRs 352, and/or XOR gate 114B input may be configurable. Alternatively, all the parameters may be pre-determined.

Figure 4:
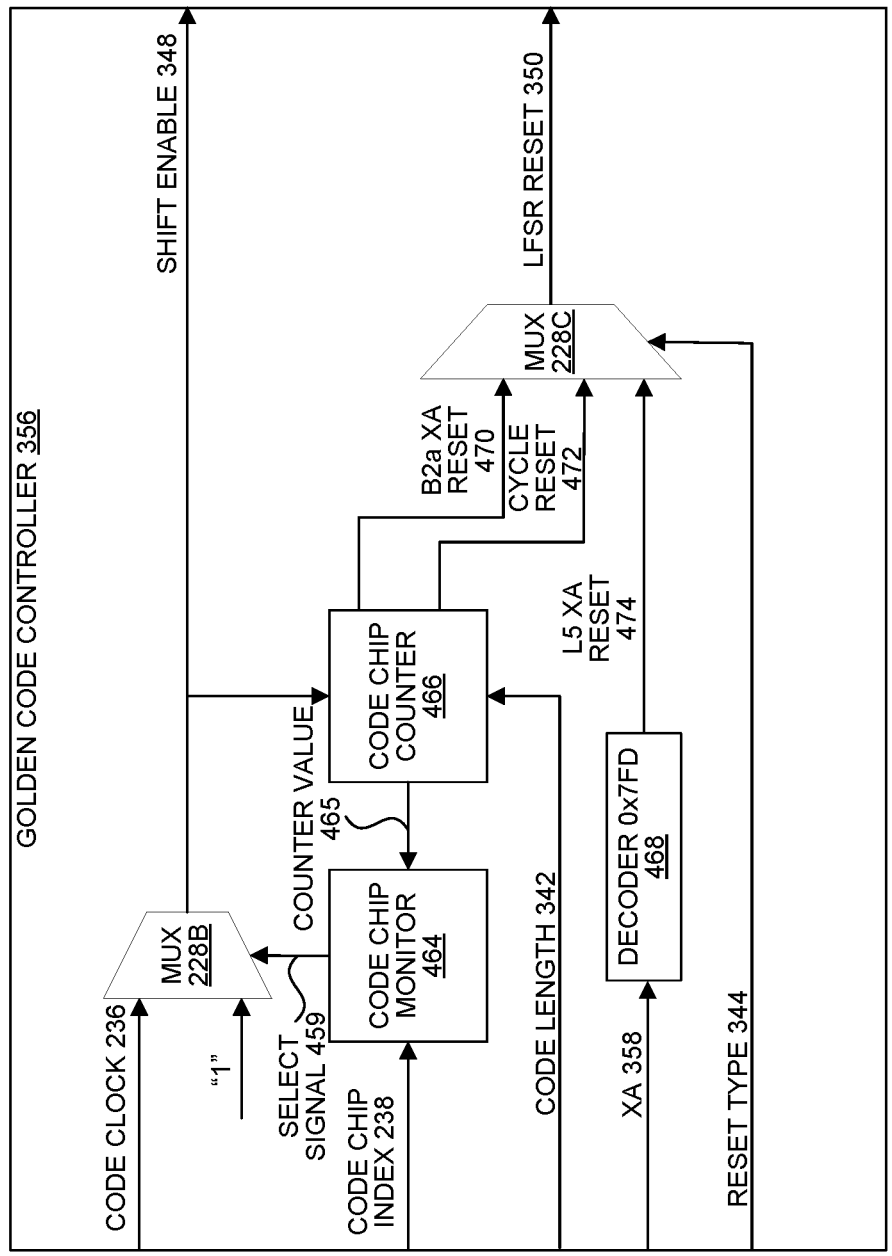
FIG. 4 is a block diagram illustrating an example Golden code controller.

FIG. 4 is a block diagram illustrating an example Golden code controller 356. The Golden code controller 356 may be included in a Golden code generator 237. The Golden code controller 356 may include a code chip monitor 464, a code chip counter 466, and a decoder 468. The Golden code controller 356 may be configured to generate a shift enable 348 signal and an LFSR reset 350 signal based on a variety of inputs.

A multiplexer 228B may be configured to select the shift enable signal 348 among the code clock 236 from the DCO 112 and a system clock using the select signal from code chip monitor 464. Since the system clock is faster than code clock 236, if "1" is input into the multiplexer 228B, the system clock will replace code clock 236, i.e., one system clock may output one code bit. In other words, the shift enable 348 signal may be selected between the code clock 236 (from the DCO 112) and "1." When the code clock 236 is selected, the LFSR 352 may shift one bit when the DCO 112 generates one code clock 236. Alternatively, when "1" is selected, the LFSR 352 may shift one bit every system clock cycle.

The selecting port of multiplexer 228B may be controlled by a code chip monitor 464. The code chip monitor 464 may be configured to compare the code chip index 238 (from the DCO 112) with the counter value 465 from the code chip counter 466, and generate a select signal 459 based on the comparison. To quickly change the Golden code index, the LFSR 352 may be shifted every system clock cycle instead of every code clock cycle, until the index of LFSR 352 equals to what we expected. This mechanism requires a comparator between code counter value 465 and the code chip index 238, i.e., the code chip monitor may perform that comparison. When the current code chip index 238 of an LFSR 352 is different from the code chip index 238 from DCO 112, the "1" may be selected so the code chip index 238 of the LFSR 352 can quickly catch up with code chip index 238 from the DCO 112.

The LFSR reset 350 signal is selected among three signals: B2a XA reset 470 (from a code chip counter 466), L5 XA reset 474 (from a decoder 468), and cycle reset 472 (from the code chip counter 466). The B2a XA reset 470, L5 XA reset 474, and cycle reset 472 signals may be required by and/or defined in the BeiDou and/or GPS ICDs.

The code chip counter 466 may be configured to count the number of code clocks 236 and produce a counter value 465. The code chip counter 466 may also be configured to (1) generate the B2a XA reset 470 when the code chip index 238 is 8190 (e.g., as defined in the BeiDou ICD); and (2) generate the cycle reset 472 when the code chip counter 466 accumulates to the number of code length 342 (e.g., 1023), after which the Golden code generator 237 may reset. The decoder 468 may generate the L5 XA reset 474 when it determines that the XA chip 358 bit sequence (from the first LFSR 352A) is 0x7FD.

The reset type 344 (e.g., in the code parameters 232 included in the code info 120) may act as a select signal to a multiplexer 228C between the B2a XA reset 470 signal, the L5 XA reset 474 signal, and the cycle reset 472 signal to generate an LFSR reset 350 signal.

Figure 5:
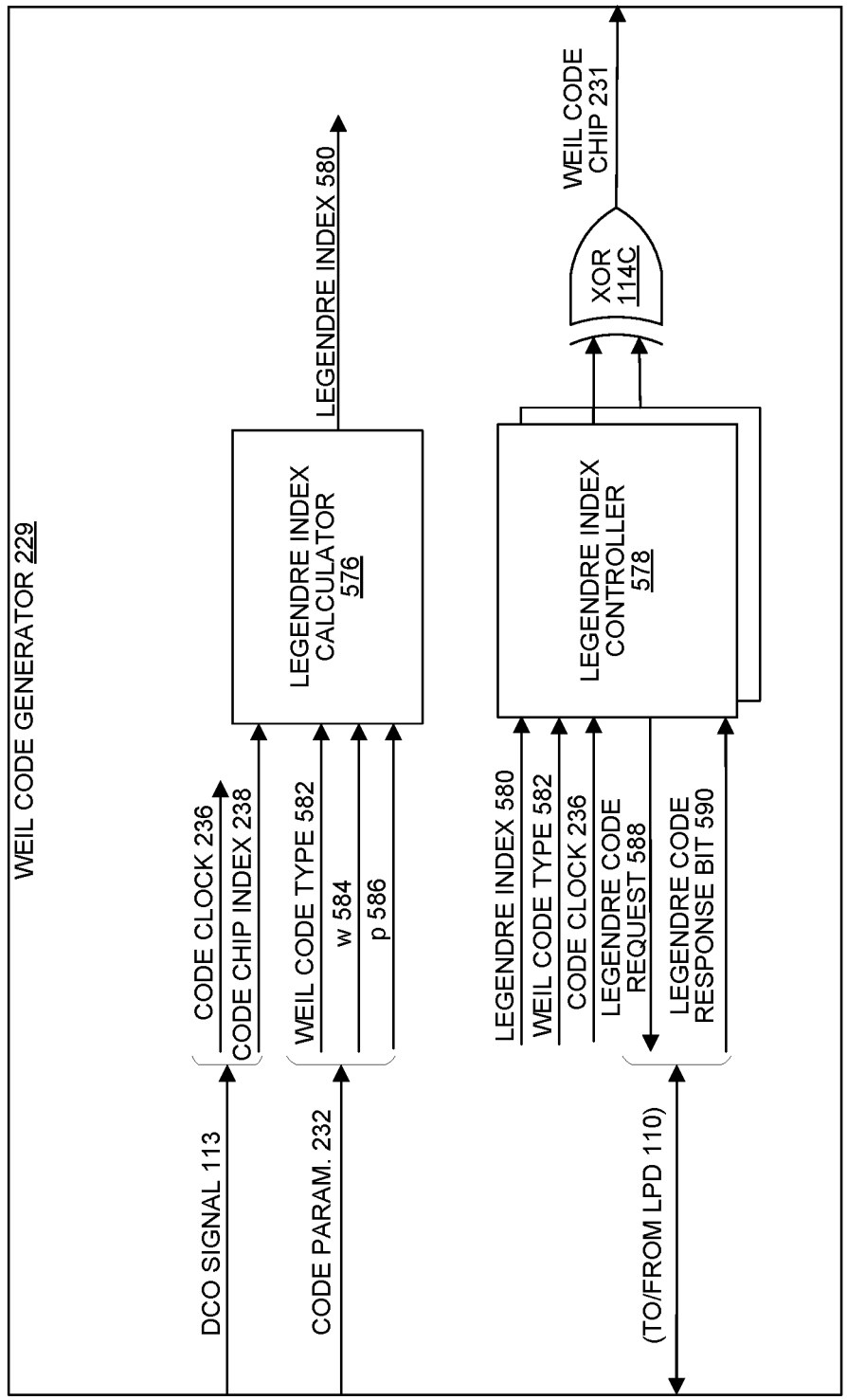
FIG. 5 is a block diagram illustrating an example Weil code generator.

FIG. 5 is a block diagram illustrating an example Weil code generator 229. The Weil code generator 229 may be included in a primary code generator 106A and/or a secondary code generator 106B in a universal PRN code generator 102.

Referring back to FIG. 5, the Weil code generator 229 may receive the DCO signal 113 (from the DCO 112) and the code parameters 232 (e.g., as part of the code info 120) as inputs. The Weil code generator 229 may also communicate with the Legendre polynomial distributor 110, i.e., send Legendre code requests 588 and receive Legendre code response bits 590. Based on these inputs, the Weil code generator 229 may generate a series of Weil code chips 231, which together form a Weil code.

The Weil code generator 229 may include a Legendre index calculator 576 and two Legendre index controllers 578. The Legendre index calculator 576 may be configured to convert the code chip index 238 (in the DCO signal 113 from the DCO 112) to Legendre index 580 using the code parameters 232 (included in the code info 120 from the register controller 104). A possible conversion rule (from code chip index 238 to Legendre index 580) will be discussed below in connection with FIG. 6.

Each Legendre index controller 578 may be configured to create and send a Legendre code request 588 (that includes the Legendre index 580) to the LPD 110. The Legendre code request 588 may be a request for a Legendre code response bit from the LPD 110. In response to their respective Legendre code requests 588, each Legendre index controller 578 may receive (and store) a Legendre code response bit 590 from the LPD 110. Each Legendre index controller 578 may output a Legendre code response bit 590 in a respective Legendre bit sequence every code clock 236.

A Weil code of length N may be generated by XORing (using an XOR gate 114C) two Legendre code response bits 590 (output by the Legendre index controllers 578) according to the following equation: W(t;w)=L(t)⊕(t) L((t+w)mod N); where t is the Weil code index, w 584 is index difference between two Legendre bit sequence, L(x) is a Legendre bit sequence (of length N) at Weil code index x, W(t;w) is the Weil code chip 231 for Weil code index t and index difference (between two Legendre bit sequences) w, "mod" is a modulo division operation, and ⊕ is an XOR operation. This equation can be found in both L1C and B1C ICD.

Another parameter for Weil code, p 586, has different meanings between GPS and BeiDou signals according to their respective ICDs. In GPS L1C, p 586 may indicate the position where a common 7-bit expansion sequence 0x34 inserted. In BeiDou p 586 may indicate the position where a Weil code is truncated, i.e., the Weil code is truncated from the pth bit. Thus, the Weil code generator 229 may have two working modes, L1C mode and B1C mode.

The Weil code type 582 may indicate L1C type or B1C type. Neither L1C nor B1C code is exactly the same as conventional Weil code. Specifically, L1C inserts 7 bits into a 10223-bit Weil code and B1c truncates 10230 bits from a 10243-bit Weil code. Accordingly, the Weil code type 582 is used so the Weil code generator 229 can insert or truncate where necessary for L1C type or B1C type, respectively.

Figure 6:
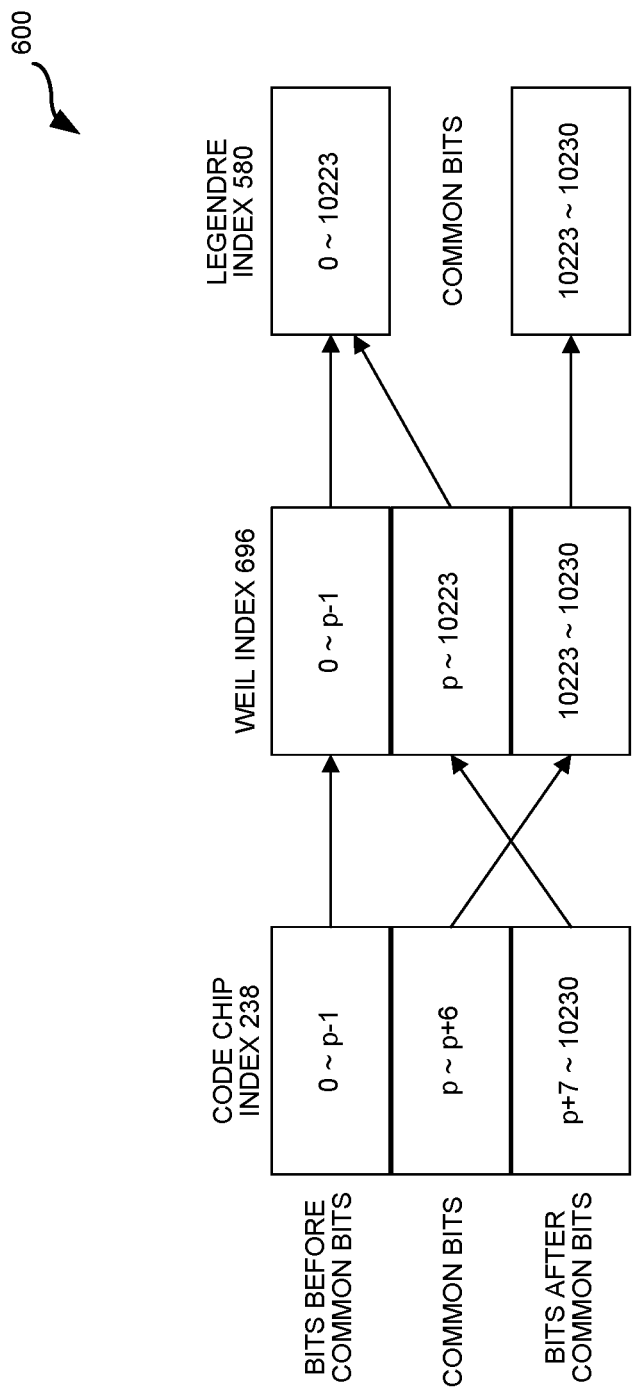
FIG. 6 is a block diagram illustrating a conversion rule from code chip index to Weil index.

FIG. 6 is a block diagram illustrating a conversion rule 600 from code chip index 238 to Weil index 696, e.g., according to L1C ICD. The conversion rule 600 may be used by the Legendre index calculator 576 in the Weil code generator 229. Specifically, the conversion rule 600 of FIG. 6 illustrates conversion from (1) code chip index 238 is aligned with the final PRN code, i.e., the code chip index 238 is the counter of final PRN code; (2) based on code chip index 696, the Weil index 696 may be deduced/determined; and (3) based on Weil index 696, the Legendre index 580 may be deduced/determined. The Legendre index 580 may be used as an index in a look up table (in the LPD 110) to get a Legendre polynomial bit. Two Legendre bits may be XORed to output a Weil code chip 231, which may be used as a PRN code chip 101.

The first column illustrates bits according to code chip index 238. Specifically, bits 0–(p−1) are bits before common bits, bits p–(p+6) are common bits, and bits (p+7)–10230 are bits after common bits.

The second column illustrates bits according to Weil index 696. Specifically, bits 0–(p−1) are bits before common bits, bits p–10223 are common bits, and bits 10223-10230 are bits after common bits.

In other words, in L1C mode, the conversion rule 600 may be described according to the following equation:

$$t_w = \begin{cases} t_c, & 0 \le t_c < p \\ t_c - p + 10223, & p \le t_c < p+7 \\ t_c - 7, & p+7 \le t_c < 10230 \end{cases}$$

wherein $t_c$ is code chip index 238, and $t_w$ is Weil code index. The Weil code length is 10223 bits for an L1C signal. So the Weil index 696 should be 0~10222. The L1C code length is 10230, so the index should be 0~10229. An additional 7 bits are an inserted sequence. Another 10230-bit "Weil code" may be defined, which is different from original Weil code definition. The first 10223 bits may be the same as original Weil code and the last 7 bits are the inserted sequence.

Alternatively, in B1C mode, the conversion rule 600 may be mathematically described according to the following mathematical equation:

$$t_w = ((t_c + p - 1) \bmod N)$$

where N is the length of Legendre polynomial.

The third column illustrates bits according to the Legendre index 580. Specifically, bits 0-10223 may be considered bits before common bits and bits 10223-10230 may be considered bits after common bits. The 10223-bits Weil code may be the exclusive-or of L(t) and a shift of L(t).

Figure 7:
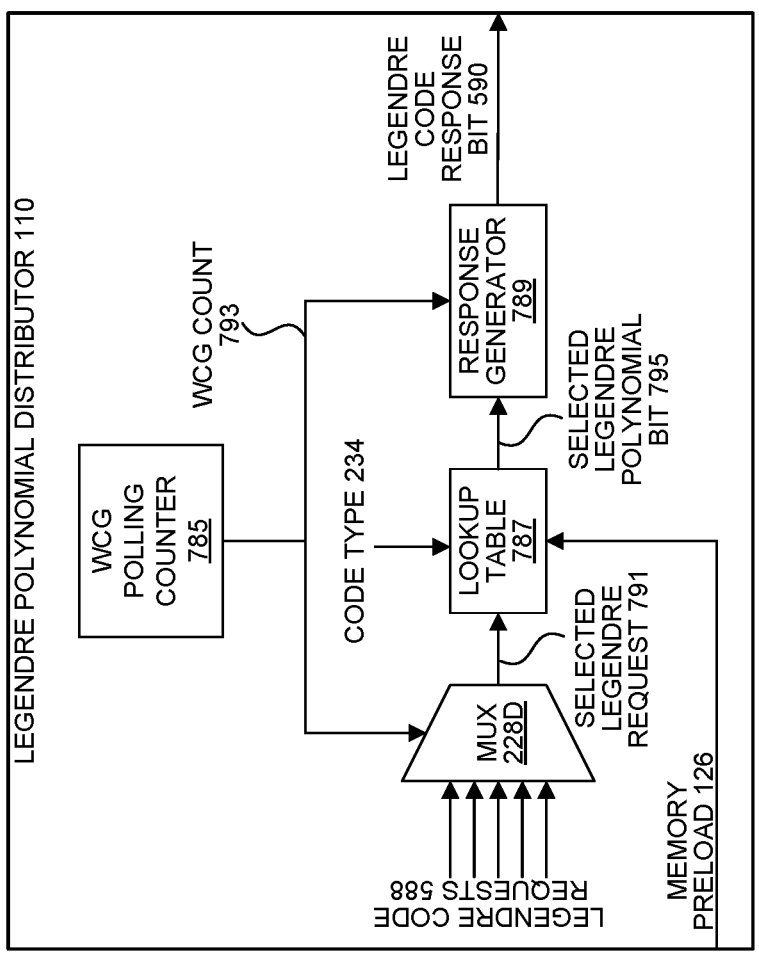
FIG. 7 is a block diagram illustrating a Legendre polynomial distributor.

FIG. 7 is a block diagram illustrating a Legendre polynomial distributor 110. The Legendre polynomial distributor 110 may be included in a universal PRN code generator 102 and may be configured to generate Legendre code response bits 590 in response to multiple Legendre code requests 588 from multiple Weil code generators 229.

A lookup table 787 may be the core function of the LPD 110. During system starts up (i.e., memory preload 126), one or more Legendre polynomials may be loaded into a lookup table 787 in the Legendre polynomial distributor 110. A polling mechanism may be used so that a single LPD 110 can serve multiple Weil code generators 229. There's a circulation counter in LDP. The current value of the counter stands for current polled request. The LPD will load the request from the MUX, then sends responds to back with a selecting signal.

A Weil code generator (WCG) polling counter 785 may indicate the number of currently polled Weil code generators 229 (WCG count 793). One of multiple Legendre code requests 588 from the polled Weil code generators 229 may be selected by a multiplexer 228D (using the WCG count 793 from the WCG polling counter 785 as a select signal) and output to a lookup table 787. The lookup table 787 may be configured to produce two Legendre polynomial bits using the selected Legendre code request 791, then select one of the Legendre polynomial bits (i.e., the selected Legendre polynomial bit 795) using the code type 234. A response generator 789 may then send a Legendre code response bit 590 to the polled Weil code generator 229. The Legendre code response bit 590 may be transmitted with channel information. Since the LPD 110 may receive many input requests 588 and output a single output response 590 at a time, the channel information may be the currently polled channel number, e.g., WCG count 793.

Figure 8:
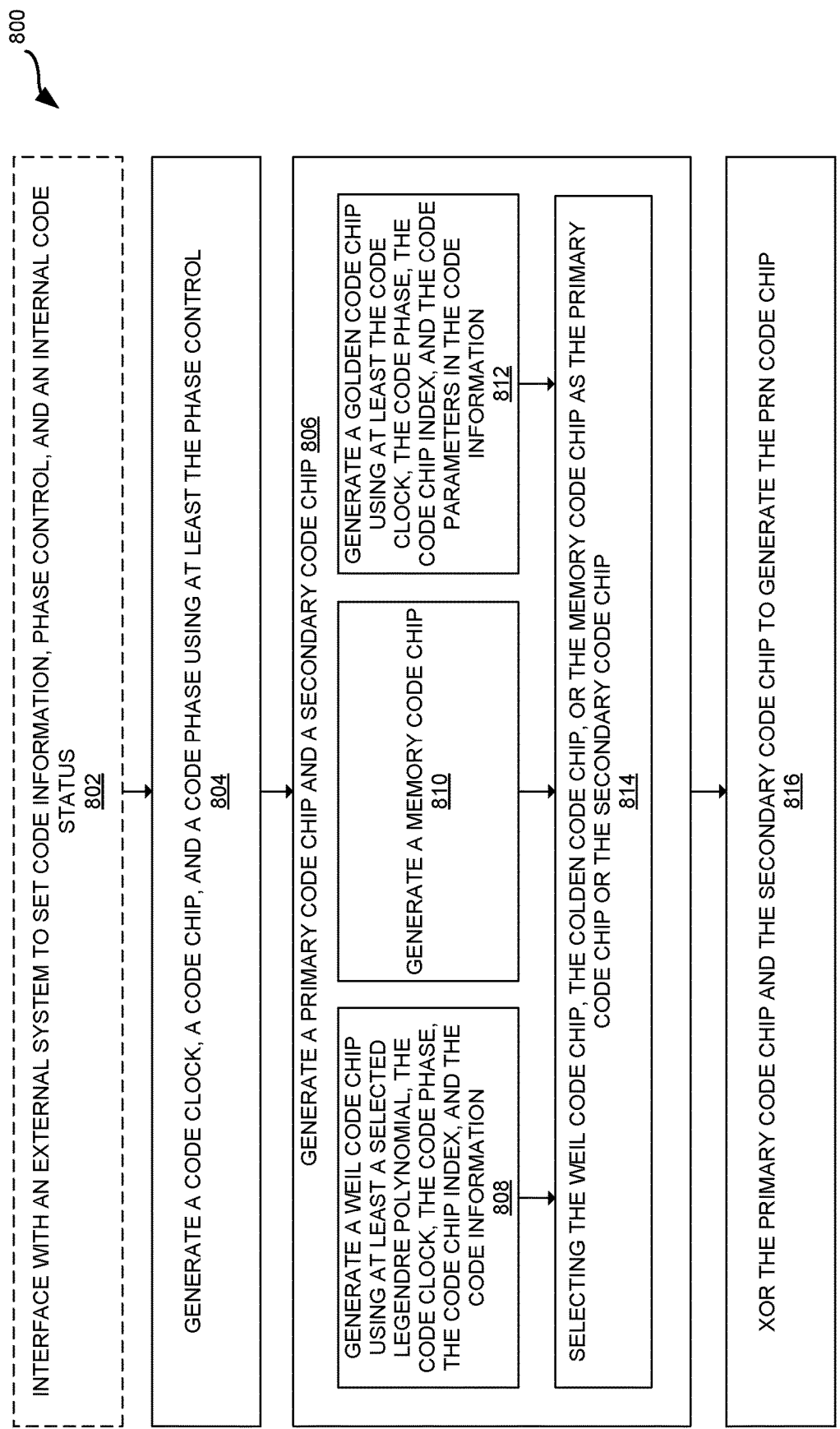
FIG. 8 is a flow diagram illustrating an example method for generating a PRN code chip.

FIG. 8 is a flow diagram illustrating an example method 800 for generating a PRN code chip 101. Although the method 800 is only described for a single PRN code chip 101, the method 800 may be performed iteratively to produce a sequence of PRN code chips 101, i.e., PRN code. The method 800 may be performed by a universal PRN code generator 102 implemented in at least one processor 107, e.g., an FPGA or ASIC.

Optionally, the at least one processor 107 may be configured to interface 802 (e.g., using a register controller 104) with an external system 105 to set code information 120, phase control 118, and an internal code status 116. Alternatively, the code information 120, phase control 118, and an internal code status 116 may be set in another way. The at least one processor 107 may also be configured to generate 804 (e.g., using a DCO 112) a code clock 236, a code phase 227, and a code chip index 238 using at least the phase control 118.

The at least one processor 107 may also be configured to generate 806 a primary code chip 115A (e.g., using a primary code generator 106A) and a secondary code chip 115B (e.g., using a secondary code generator 106B). Generating the primary code chip 115A and the secondary code chip 115B may include generating 808 a Weil code chip 231 (e.g., using a Weil code generator 229) using at least a selected Legendre polynomial bit 795, the code clock 236, the code phase 227, the code chip index 238, and the code information 120. To generate the Weil code chip 231, the at least one processor 107 may be configured to convert the code chip index 238 to a Legendre index 580, and create a Legendre code request 588 that includes the Legendre index 580. The at least one processor 107 may also store a Legendre code response bit 590 received in response to the Legendre code request 588, and output the Legendre code response bit 590 based on the code clock 236, e.g., each of two Legendre index controllers 578 may output a Legendre code response bit 590 every code clock 236. The at least one processor 107 may also XOR the Legendre code response bit 590 (e.g., from a first Legendre index controller 578) with another Legendre code response bit 590 (e.g., from a second Legendre index controller 578) to produce the Weil code chip 231.

In one configuration, the at least one processor 107 may receive multiple Legendre code requests 588, e.g., from different Legendre index controllers 578 and/or different Weil code generators 229. For each of the Legendre code requests 588, the at least one processor 107 may send a Legendre code response bit 590. For each a Legendre code response bit 590, the at least one processor 107 may be configured to: (1) produce a WCG count 793 that indicates a number of Weil code generators 229 being polled; (2) select one Legendre code request 588 among the multiple Legendre code requests 588 from the multiple Weil code generators 229 based on the WCG count 793; (3) produce two Legendre polynomial bits using the selected Legendre code request 791; (4) select one of the Legendre polynomial bits using the code type 234; and (5) send the selected Legendre polynomial bit 795, as a Legendre code response bit 590, to a currently polled Weil code generator 229.

Generating the primary code chip 115A and the secondary code chip 115B may also include generating 810 a memory code chip 235 (e.g., using a memory code generator 233). For example, if the code type 234 is memory code, an external system 105 may write memory code to the memory code generator 233 via a memory preload port 126, which then outputs a memory code chip 235, e.g., every code clock 236.

Generating the primary code chip 115A and the secondary code chip 115B may also include generating 812 a Golden code chip 239 (e.g., using a Golden code generator 237) using at least the code clock 236, the code phase 227, the code chip index 238, and code parameters 232 in the code information 120. To generate the Golden code chip 239, the at least one processor 107 may also be configured to generate a shift enable signal 348 and a linear feedback shift register (LFSR) reset signal 350 using at least the code clock 236, the code phase 227, and the code chip index 238. The at least one processor 107 may also be configured to generate the shift enable signal 348 by (1) counting a number of code clocks 236 to produce a counter value 465, e.g., using a code chip counter 466; (2) comparing the code chip index 238 with the counter value 465, and generating a select signal based on the comparison; and (3) selecting the shift enable signal 348 among the code clock 236 and a system clock (e.g., "1") using the select signal. When the shift enable 348 is active, the LFSRs 352 may shift one bit.

The at least one processor 107 may also be configured to generate the LFSR reset signal 348 by: (1) generating (e.g., by a code chip counter 466) a B2a XA reset signal 470 when the code chip index is 8190; (2) generating a cycle reset signal 472 when the code chip counter 466 accumulates to a number of code length 342; and (3) generating an L5 XA reset when the decoder 468 determines that a bit sequence from the first LFSR 352A (e.g., accumulated XA chips 358) is 0x7FD. When the LFSR reset 350 is active, the registers (e.g., LFSRs 352) may reset to the initial value.

To generate the Golden code chip 239, the at least one processor 107 may also be configured to: (1) generate (e.g., using a first LFSR 352A) an X1A chip 358 using the shift enable signal 348, the LFSR reset signal 350, a register initial value, an LFSR length, and a polynomial in the code parameters 232; (2) generate an X1B chip 360 using the shift enable signal 348, the LFSR reset signal 350, the register initial value, the LFSR length, and the polynomial in the code parameters 120; and (3) XOR the X1A chip 358 and the X1B chip 360 together to produce the Golden code chip 239.

As illustrated in FIG. 8, the Weil code chip 231, the memory code chip 235, and the Golden code chip 239 may be generated in parallel. Specifically, the Weil code generator 229, memory code generator 233, and Golden code generator 237 exist as individual circuits, e.g., in a single ASIC or FPGA. Based on the configuration, only one the Weil code generator 229, memory code generator 233, and Golden code generator 237 is enabled to work for each specific channel. A single receiver 100 can maintain dozens of channels at the same time, and each channel has its own universal code generator 102, which may have a specific configuration.

Generating the primary code chip 115A and the secondary code chip 115B may also include selecting 814 (e.g., using a multiplexer 228A) the Weil code chip 231, the Golden code chip 239, or the memory code chip 235 as the primary code chip 115A or the secondary code chip 115B. In other words, the primary code generator 106A may select a Weil code chip 231, a Golden code chip 239, or a memory code chip 235 as the primary code chip 115A. Similarly, the secondary code generator 106B may select a Weil code chip 231, a Golden code chip 239, or a memory code chip 235 as the primary code chip 115B. The at least one processor 107 may also be configured to XOR 816 the primary code chip 115A and the secondary code chip 115B to generate the PRN code chip 101.

Electronic Device Overview

Configurations of the present disclosure include various steps and operations, which have been described above. A variety of these steps and operations may be performed by hardware components or may be embodied in machine-executable instructions, which may be used to cause a general-purpose or special-purpose processor programmed with the instructions to perform the steps. Alternatively, the steps may be performed by a combination of hardware, software, and/or firmware.

Figure 9:
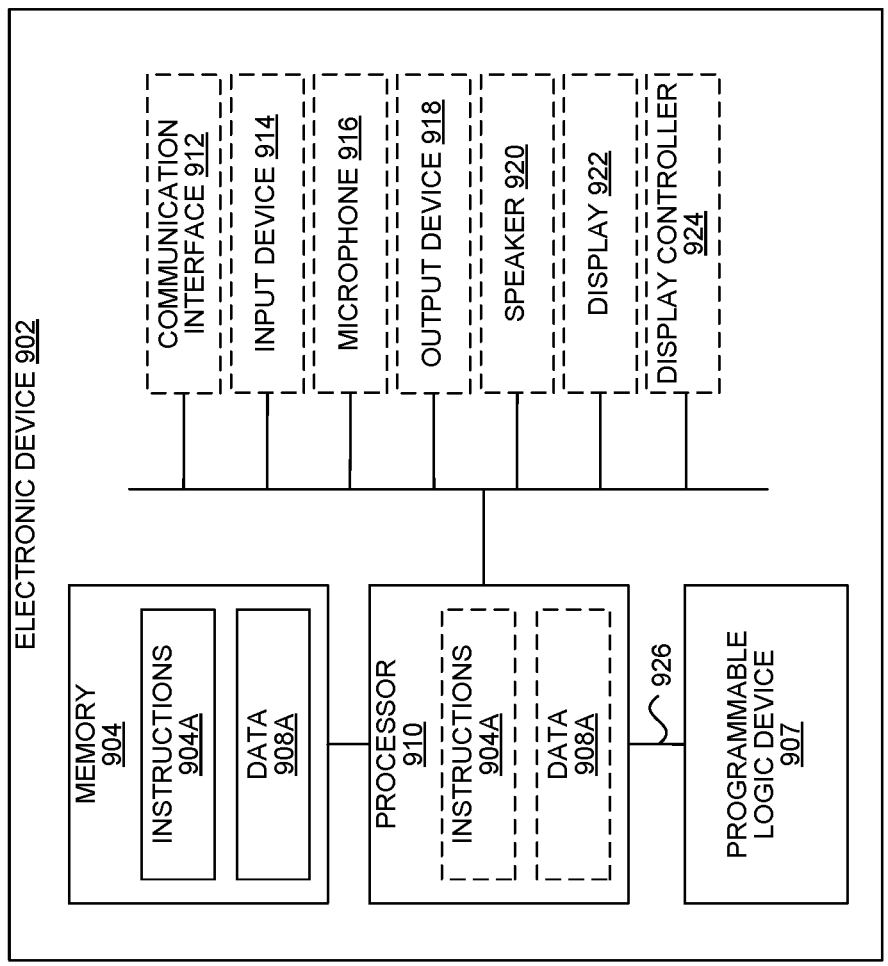
FIG. 9 is a block diagram illustrating an example of an electronic device that may be utilized in some configurations of the present disclosure.

As such, FIG. 9 is a block diagram illustrating an example of an electronic device that may be utilized in some configurations of the present disclosure. The illustrated components may be located within the same physical structure or in separate housings or structures. The electronic device 100 described above may utilize one or more of the electronic devices 902 described in FIG. 9. The electronic device 902 includes a processor 910, e.g., that implements the external system 105. The processor 910 may be a general purpose single- or multi-chip microprocessor (e.g., an ARM), a special purpose microprocessor (e.g., a digital signal processor (DSP)), a microcontroller, a programmable gate array, a Field Programmable Gate Array (FPGA), an application specific integrated circuit (ASIC), etc. The processor 910 may be referred to as a central processing unit (CPU). Although just a single processor 910 is shown in the electronic device 902 of FIG. 9, in an alternative configuration, a combination of processors (e.g., an ARM and DSP) could be used. The processor 910 may be used to implement (or partially implement) the processor 107 described above.

The electronic device 902 may also include a programmable logic device 907 (e.g., PLD, FPGA, ASIC, etc.) to implement one or more universal PRN generators 102. The programmable logic device 907 may be communicatively coupled to the processor 910 (e.g., the external system acting as a controller) on a data and address bus 926 that runs between the programmable logic device 907 and the processor 910.

The electronic device 902 also includes memory 904 in electronic communication with the processor 910. That is, the processor 910 can read information from and/or write information to the memory 904. The memory 904 may be any electronic component capable of storing electronic information. The memory 904 may include a machine-readable medium (also referred to as a computer-readable medium) having stored thereon instructions that may be used to program a computer (or other electronic devices) to perform a process. The machine-readable medium may include, for example, floppy diskettes, optical disks, compact disc read-only memories (CD-ROMs), digital video discs (DVDs), magneto-optical disks, read-only memories (ROMs), random access memories (RAMs), erasable programmable read-only memories (EPROMs), electrically erasable programmable read-only memories (EEPROMs), magnetic or optical cards, flash memory, or other type of media/machine-readable medium suitable for storing electronic instructions. The machine-readable medium may be tangible and non-transitory.

Data 908a and instructions 906a may be stored in the memory 904. The instructions 906a may include one or more programs, routines, sub-routines, functions, procedures, etc. The instructions 906a may include a single computer-readable statement or many computer-readable statements. The instructions 906a may be executable by the processor 910 to implement one or more of the methods, functions and procedures described above. Executing the instructions 906a may involve the use of the data 908a that is stored in the memory 904. FIG. 9 shows some instructions 906b and data 908b being loaded into the processor 910 (which may come from instructions 906a and data 908a).

The electronic device 902 may also include one or more communication interfaces 912 for communicating with other electronic devices. The communication interfaces 912 may be based on wired communication technology, wireless communication technology, or both. Examples of different types of communication interfaces 912 include a serial port, a parallel port, a Universal Serial Bus (USB), an Ethernet adapter, an IEEE 1394 bus interface, a small computer system interface (SCSI) bus interface, an infrared (IR) communication port, a Bluetooth wireless communication adapter, and so forth.

The electronic device 902 may also include one or more input devices 914 and one or more output devices 918, e.g., used in conjunction with a user interface. Examples of different kinds of input devices 914 include a keyboard, mouse, microphone, camera remote control device, button, touchscreen, etc. For instance, the electronic device 902 may include one or more microphones 916 that convert acoustic signals (e.g., voice, speech) into electrical or electronic signals. In another example, a camera may track position and/or motion of an object and convert the image(s)/video into instructions to control other devices.

Examples of different kinds of output devices 918 include a speaker, printer, etc. For instance, the electronic device 902 may include one or more speakers 920. In one configuration, a speaker 920 may be a transducer that converts electrical or electronic signals into acoustic signals. One specific type of output device which may be typically included in an electronic device 902 is a display device 922. Display devices 922 used with configurations disclosed herein may utilize any suitable image projection technology, such as a cathode ray tube (CRT), liquid crystal display (LCD), light-emitting diode (LED), organic light-emitting diode (OLED), gas plasma, electroluminescence, or the like. A display controller 924 may also be provided, for converting data stored in the memory 904 into text, graphics, and/or moving images (as appropriate) shown on the display device 922.

The various optional components of the electronic device 902 (other than the programmable logic device 907) may be coupled directly or indirectly to the processor 910. The coupling may include a power bus, a control signal bus, a status signal bus, a data bus, etc. Furthermore, various other architectures and components may be utilized in connection with any electronic device described herein.

Terminology

Brief definitions of terms, abbreviations, and phrases used throughout this application are given below.

The term "determining" may include calculating, computing, processing, deriving, investigating, looking up (e.g., looking up in a table, a database or another data structure), ascertaining and the like. Also, "determining" may also include receiving (e.g., receiving information), accessing (e.g., accessing data in a memory) and the like. Also, "determining" may include resolving, selecting, choosing, establishing and the like.

The phrase "based on" does not mean "based only on," unless expressly specified otherwise. In other words, the phrase "based on" describes both "based only on" and "based at least on". Additionally, the term "and/or" means "and" or "or". For example, "A and/or B" can mean "A", "B", or "A and B". Additionally, "A, B, and/or C" can mean "A alone," "B alone," "C alone," "A and B," "A and C," "B and C" or "A, B, and C."

The terms "connected", "coupled", and "communicatively coupled" and related terms are used in an operational sense and are not necessarily limited to a direct physical connection or coupling. Thus, for example, two devices may be coupled directly, or via one or more intermediary media or devices. As another example, devices may be coupled in such a way that information can be passed there between, while not sharing any physical connection with one another. Based on the disclosure provided herein, one of ordinary skill in the art will appreciate a variety of ways in which connection or coupling exists in accordance with the aforementioned definition.

The phrases "in exemplary configurations", "in example configurations", "in some configurations", "according to some configurations", "in the configurations shown", "in other configurations", "configurations", "in examples", "examples", "in some examples", "some examples" and the like generally mean the particular feature, structure, or characteristic following the phrase is included in at least one configuration of the present disclosure, and may be included in more than one configuration of the present disclosure. In addition, such phrases do not necessarily refer to the same configurations or different configurations.

If the specification states a component or feature "may," "can," "could," or "might" be included or have a characteristic, that particular component or feature is not required to be included or have the characteristic.

The terms "responsive" or "in response to" may indicate that an action is performed completely or partially in response to another action.

The term "module" refers broadly to a software, hardware, circuitry, or firmware (or any combination thereof) component. Modules are typically functional components that can generate useful data or other output using specified input(s). A module may or may not be self-contained. An application program (also called an "application") may include one or more modules, or a module can include one or more application programs.

Also, for the sake of illustration, various configurations of the present disclosure have herein been described in the context of computer programs, physical components, and logical interactions within modern computer networks. Importantly, while these configurations describe various configurations of the present disclosure in relation to modern computer networks and programs, the method and apparatus described herein are equally applicable to other systems, devices, and networks as one skilled in the art will appreciate. As such, the illustrated applications of the configurations of the present disclosure are not meant to be limiting, but instead are examples. Other systems, devices, and networks to which configurations of the present disclosure are applicable include, for example, other types of communication and computer devices and systems. More specifically, configurations are applicable to communication systems, services, and devices such as cell phone networks and compatible devices. In addition, configurations are applicable to all levels of computing from the personal computer to large network mainframes and servers.

In the above description, reference numbers have sometimes been used in connection with various terms. Where a term is used in connection with a reference number, this may be meant to refer to a specific element that is shown in one or more of the Figures. Where a term is used without a reference number, this may be meant to refer generally to the term without limitation to any particular Figure.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

In conclusion, the present disclosure provides novel systems, methods, and arrangements for a universal pseudo-random noise code generator. While detailed descriptions of one or more configurations of the disclosure have been given above, various alternatives, modifications, and equivalents will be apparent to those skilled in the art without varying from the spirit of the disclosure. For example, while the configurations described above refer to particular features, functions, procedures, components, elements, and/or structures, the scope of this disclosure also includes configurations having different combinations of features, functions, procedures, components, elements, and/or structures, and configurations that do not include all of the described features, functions, procedures, components, elements, and/or structures. Accordingly, the scope of the present disclosure is intended to embrace all such alternatives, modifications, and variations as fall within the scope of the claims, together with all equivalents thereof. Therefore, the above description should not be taken as limiting.

Example Embodiments

Example 1 includes a pseudo-random noise (PRN) code generator, comprising: a register controller configured to interface with an external system that sets code information and phase control, wherein the register controller also stores a current internal code status; a digitally controlled oscillator (DCO) configured to receive the phase control and generate a code clock, a code chip index, and a code phase; a primary code generator configured to generate a primary code chip and a secondary code generator configured to generate a secondary code chip, the primary code generator and the secondary code generator each comprising: a Weil code generator configured to generate a Weil code chip; a memory code generator configured to generate a memory code chip; a Golden code generator configured to generate a Golden code chip; and a first multiplexer configured to generate the Weil code chip, the Golden code chip, or the memory code chip as the primary code chip or the secondary code chip; a first XOR gate configured to XOR the primary code chip and the secondary code chip to generate a PRN code chip.

Example 2 includes the PRN code generator of Example 1, wherein the Weil code generator is configured to generate the Weil code chip using at least: a selected Legendre polynomial bit from a Legendre polynomial distributor; the code clock, the code phase and the code chip index from the DCO; and the code information from the register controller.

Example 3 includes the PRN code generator of Example 2, wherein the Weil code generator comprises: a Legendre index calculator configured to convert the code chip index to a Legendre index; a Legendre index controller configured to: create a Legendre code request that includes the Legendre index; store Legendre code response bits received from the Legendre polynomial distributor in response to the Legendre code request; and outputs the Legendre code response bits based on the code clock; and a second XOR gate configured to XOR the Legendre code response bits to produce the Weil code chip.

Example 4 includes the PRN code generator of any of Examples 1-3, wherein the Legendre polynomial distributor receives Legendre code requests from and sends Legendre code responses to multiple Weil code generators, wherein the Legendre polynomial distributor comprises: a WCG polling counter configured to produce a WCG count that indicates a number of Weil code generators being polled; a second multiplexer configured to select one Legendre code request among the multiple Legendre code requests from the multiple Weil code generators based on the WCG count; Example 5 includes the PRN code generator of Example 4, wherein the Legendre polynomial distributor further comprises: a lookup table configured to produce two Legendre polynomial bits using the selected Legendre code request, and select one of the Legendre polynomial bits using the code type; and a response generator configured to send the selected Legendre polynomial bit, in a Legendre code response, to a currently polled Weil code generator.

Example 6 includes the PRN code generator of any of Examples 1-5, wherein the Golden code generator is configured to generate the Golden code chip using at least: the code clock, the code phase, and the code chip index from the DCO; and code parameters in the code information from the register controller.

Example 7 includes the PRN code generator of Example 6, wherein the Golden code generator comprises: a Golden code controller configured to generate a shift enable signal and a linear feedback shift register (LFSR) reset signal using at least the code clock, the code phase and the code chip index from the DCO; a first LFSR configured to generate an X1A chip using the shift enable signal, the LFSR reset signal from the Golden code controller and a register initial value, an LFSR length, and a polynomial in the code parameters; a second LFSR configured to generate an X1B chip using the shift enable signal, the LFSR reset signal from the Golden code controller and the register initial value, the LFSR length, and the polynomial in the code parameters; and a third XOR gate configured to XOR the X1A chip and the X1B chip to produce the Golden code chip.

Example 8 includes the PRN code generator of Example 7, wherein the Golden code controller is configured to generate the shift enable signal and the chip reset signal using the code information, wherein the Golden code controller comprises: a code chip counter configured to count a number of code clock cycles to produce a counter value; and a code chip monitor configured to compare the code chip index from the DCO with the counter value from the code chip counter, and generate a select signal based on the comparison; and a third multiplexer configured to select the shift enable signal among the code clock from the DCO and a system clock using the select signal from code chip monitor.

Example 9 includes the PRN code generator of Example 8, wherein the code chip counter is further configured to generate a B2a XA reset signal when the code chip index is 8190; wherein the code chip counter is further configured to generate a cycle reset when the code chip counter accumulates to a number of code length, after which the Golden code generator may reset; wherein the Golden code controller further comprises a decoder that is configured to generate an L5 XA reset signal when the decoder determines that a bit sequence from the first LFSR is 0x7FD; wherein a fourth multiplexer is configured to select, based on a reset type signal in the code parameters, the B2a XA reset signal, the cycle reset, or the L5 XA reset signal as the LFSR reset signal.

Example 10 includes a method for generating a pseudorandom noise (PRN) code chip, comprising: interfacing with an external system to set code information, phase control, and an internal code status; generating a code clock, a code chip index, and a code phase using at least the phase control; generating a primary code chip and a secondary code chip, comprising for each of the primary code chip and the secondary code chip: generating a Weil code chip using at least a selected Legendre polynomial, the code clock, the code phase, the code chip index, and the code information; generating a memory code chip; generating a Golden code chip using at least the code clock, the code phase, the code chip index, and code parameters in the code information; selecting the Weil code chip, the Golden code chip, or the memory code chip as the primary code chip or the secondary code chip; and XORing the primary code chip and the secondary code chip to generate the PRN code chip.

Example 11 includes the method of Example 10, wherein the generating a Weil code chip comprises: converting the code chip index to a Legendre index; creating a Legendre code request that includes the Legendre index; storing a Legendre code response bit received in response to the Legendre code request; and outputting the Legendre code response bit based on the code clock; and XORing the Legendre code response bit with another Legendre code response bit to produce the Weil code chip.

Example 12 includes the method of any of Examples 10-11, further comprising: receiving multiple Legendre code requests; for each of the Legendre code requests, sending a Legendre code response, comprising: producing a WCG count that indicates a number of Weil code generators being polled; selecting one Legendre code request among the multiple Legendre code requests from the multiple Weil code generators based on the WCG count; producing two Legendre polynomial bits using the selected Legendre code request; selecting one of the Legendre polynomial bits using the code type; and sending the selected Legendre polynomial bit, in a Legendre code response, to a currently polled Weil code generator.

Example 13 includes the method of any of Examples 10-12, wherein generating a Golden code chip comprises: generating a shift enable signal and a linear feedback shift register (LFSR) reset signal using at least the code clock, the code phase and the code chip index; generating an X1A chip using the shift enable signal, the LFSR reset signal, a register initial value, an LFSR length, and a polynomial in the code parameters; generating an X1B chip using the shift enable signal, the LFSR reset signal, the register initial value, the LFSR length, and the polynomial in the code parameters; and XORing the X1A chip and the X1B chip to produce the Golden code chip.

Example 14 includes the method of Example 13, further comprising generating the shift enable signal and the chip reset signal using the code information, comprising: counting a number of code clock cycles to produce a counter value; and comparing the code chip index with the counter value, and generating a select signal based on the comparison; and selecting the shift enable signal among the code clock and a system clock using the select signal.

Example 15 includes the method of Example 14, wherein generating the shift enable signal and the chip reset signal using the code information further comprises: generating a B2a XA reset signal when the code chip index is 8190; generating a cycle reset when the code chip counter accumulates to a number of code length; and generating an L5 XA reset when the decoder determines that a bit sequence from a first LFSR is 0x7FD.

Example 16 includes an electronic device, comprising: an external system configured to interface with a universal PRN code generator, wherein the external system sets code information and phase control via a register controller, wherein the register controller also stores a current internal code status; the universal PRN code generator, comprising: a digitally controlled oscillator (DCO) configured to receive the phase control information and generate a code clock, a code chip index, and a code phase; a primary code generator configured to generate a primary code chip and a secondary code generator configured to generate a secondary code chip, the primary code generator and the secondary code generator each comprising: a Weil code generator configured to generate a Weil code chip using at least: a selected Legendre polynomial bit from a Legendre polynomial distributor; the code clock, the code phase and the code chip index from the DCO; and the code information from the register controller; a memory code generator configured to generate a memory code chip; a Golden code generator configured to generate a Golden code chip using at least: the code clock, the code phase, and the code chip index from the DCO; code parameters in the code information from the register controller; and a first multiplexer configured to generate the Weil code chip, the Golden code chip, or the memory code chip as the primary code chip or the secondary code chip; a first XOR gate configured to XOR the primary code chip and the secondary code chip to generate a PRN code chip.

Example 17 includes the electronic device of Example 16, wherein the Weil code generator comprises: a Legendre index calculator configured to convert a code chip index to a Legendre index; a Legendre index controller configured to: create the Legendre code request that includes the Legendre index; store Legendre code response bits received from the Legendre polynomial distributor in response to the Legendre code request; and output the Legendre code response bits based on the code clock; and a second XOR gate configured to XOR the Legendre code response bits to produce the Weil code chip.

Example 18 includes the electronic device of any of Examples 16-17, wherein the Golden code generator comprises: a Golden code controller configured to generate a shift enable signal and a linear feedback shift register (LFSR) reset signal using at least the code clock, the code phase and the code chip index from the DCO; a first LFSR configured to generate an X1A chip using the shift enable signal, the LFSR reset signal from the Golden code controller and a register initial value, an LFSR length, and a polynomial in the code parameters; a second LFSR configured to generate an X1B chip using the shift enable signal, the LFSR reset signal from the Golden code controller and the register initial value, the LFSR length, and the polynomial in the code parameters; and a third XOR gate configured to XOR the X1A chip and the X1B chip to produce the Golden code chip.

Example 19 includes the electronic device of Example 18, wherein the Golden code controller is configured to generate the shift enable signal and the chip reset signal using the code information, wherein the Golden code controller comprises: a code chip counter configured to count a number of code clock cycles to produce a counter value; and a code chip monitor configured to compare the code chip index from the DCO with the counter value from the code chip counter, and generate a select signal based on the comparison; and a third multiplexer configured to select the shift enable signal among the code clock from the DCO and a system clock using the select signal from code chip monitor.

Example 20 includes the electronic device of Example 19, wherein the code chip counter is further configured to generate a B2a XA reset signal when the code chip index is 8190; wherein the code chip counter is further configured to generate a cycle reset when the code chip counter accumulates to a number of code length, after which the Golden code generator may reset; wherein the Golden code controller further comprises a decoder that is configured to generate an L5 XA reset when the decoder determines that a bit sequence from the first LFSR is 0x7FD; and wherein a fourth multiplexer is configured to select, based on a reset type signal in the code parameters, the B2a XA reset signal, the cycle reset, or the L5 XA reset signal as the LFSR reset signal.

What is claimed is:

1. A pseudo-random noise (PRN) code generator, comprising:
   a register controller configured to interface with an external system that sets code information and phase control, wherein the register controller also stores a current internal code status;
   a digitally controlled oscillator (DCO) configured to receive the phase control and generate a code clock, a code chip index, and a code phase;
   a primary code generator configured to generate a primary code chip and a secondary code generator configured to generate a secondary code chip, the primary code generator and the secondary code generator each comprising:
      a Weil code generator configured to generate a Weil code chip;
      a memory code generator configured to generate a memory code chip;
      a Golden code generator configured to generate a Golden code chip; and
      a first multiplexer configured to select the Weil code chip, the Golden code chip, or the memory code chip as the primary code chip or the secondary code chip;
   a first XOR gate configured to XOR the primary code chip and the secondary code chip to generate a PRN code chip.

2. The PRN code generator of claim 1, wherein the Weil code generator is configured to generate the Weil code chip using at least:
   a selected Legendre polynomial bit from a Legendre polynomial distributor;
   the code clock, the code phase and the code chip index from the DCO; and
   the code information from the register controller.

3. The PRN code generator of claim 2, wherein the Weil code generator comprises:
   a Legendre index calculator configured to convert the code chip index to a Legendre index;
   a Legendre index controller configured to:
      create a Legendre code request that includes the Legendre index;
      store Legendre code response bits received from the Legendre polynomial distributor in response to the Legendre code request; and
      outputs the Legendre code response bits based on the code clock; and
   a second XOR gate configured to XOR the Legendre code response bits to produce the Weil code chip.

4. The PRN code generator of claim 1, wherein the Legendre polynomial distributor receives Legendre code requests from and sends Legendre code responses to multiple Weil code generators, wherein the Legendre polynomial distributor comprises:
   a WCG polling counter configured to produce a WCG count that indicates a number of Weil code generators being polled;
   a second multiplexer configured to select one Legendre code request among the multiple Legendre code requests from the multiple Weil code generators based on the WCG count.

5. The PRN code generator of claim 4, wherein the Legendre polynomial distributor further comprises:
   a lookup table configured to produce two Legendre polynomial bits using the selected Legendre code request, and select one of the Legendre polynomial bits using the code type; and
   a response generator configured to send the selected Legendre polynomial bit, in a Legendre code response, to a currently polled Weil code generator.

6. The PRN code generator of claim 1, wherein the Golden code generator is configured to generate the Golden code chip using at least:

the code clock, the code phase, and the code chip index from the DCO; and code parameters in the code information from the register controller.

7. The PRN code generator of claim 6, wherein the Golden code generator comprises:
   a Golden code controller configured to generate a shift enable signal and a linear feedback shift register (LFSR) reset signal using at least the code clock, the code phase and the code chip index from the DCO;
   a first LFSR configured to generate an X1A chip using the shift enable signal, the LFSR reset signal from the Golden code controller and a register initial value, an LFSR length, and a polynomial in the code parameters;
   a second LFSR configured to generate an X1B chip using the shift enable signal, the LFSR reset signal from the Golden code controller and the register initial value, the LFSR length, and the polynomial in the code parameters; and
   a third XOR gate configured to XOR the X1A chip and the X1B chip to produce the Golden code chip.

8. The PRN code generator of claim 7, wherein the Golden code controller is configured to generate the shift enable signal and the chip reset signal using the code information, wherein the Golden code controller comprises:
   a code chip counter configured to count a number of code clock cycles to produce a counter value; and
   a code chip monitor configured to compare the code chip index from the DCO with the counter value from the code chip counter, and generate a select signal based on the comparison; and
   a third multiplexer configured to select the shift enable signal among the code clock from the DCO and a system clock using the select signal from code chip monitor.

9. The PRN code generator of claim 8,
   wherein the code chip counter is further configured to generate a B2a XA reset signal when the code chip index is 8190;
   wherein the code chip counter is further configured to generate a cycle reset when the code chip counter accumulates to a number of code length, after which the Golden code generator may reset;
   wherein the Golden code controller further comprises a decoder that is configured to generate an L5 XA reset signal when the decoder determines that a bit sequence from the first LFSR is 0x7FD;
   wherein a fourth multiplexer is configured to select, based on a reset type signal in the code parameters, the B2a XA reset signal, the cycle reset, or the L5 XA reset signal as the LFSR reset signal.

10. A method for generating a pseudo-random noise (PRN) code chip, comprising:
    interfacing with an external system to set code information, phase control, and an internal code status;
    generating a code clock, a code chip index, and a code phase using at least the phase control;
    generating a primary code chip and a secondary code chip, comprising for each of the primary code chip and the secondary code chip:
      generating a Weil code chip using at least a selected Legendre polynomial, the code clock, the code phase, the code chip index, and the code information;
      generating a memory code chip;
      generating a Golden code chip using at least the code clock, the code phase, the code chip index, and code parameters in the code information;
      selecting the Weil code chip, the Golden code chip, or the memory code chip as the primary code chip or the secondary code chip; and
    XORing the primary code chip and the secondary code chip to generate the PRN code chip.

11. The method of claim 10, wherein the generating a Weil code chip comprises:
    converting the code chip index to a Legendre index;
    creating a Legendre code request that includes the Legendre index;
    storing a Legendre code response bit received in response to the Legendre code request; and
    outputting the Legendre code response bit based on the code clock; and
    XORing the Legendre code response bit with another Legendre code response bit to produce the Weil code chip.

12. The method of claim 11, further comprising:
    receiving multiple Legendre code requests;
    for each of the Legendre code requests, sending a Legendre code response, comprising:
      producing a WCG count that indicates a number of Weil code generators being polled;
      selecting one Legendre code request among the multiple Legendre code requests from the multiple Weil code generators based on the WCG count;
      producing two Legendre polynomial bits using the selected Legendre code request;
      selecting one of the Legendre polynomial bits using the code type; and
      sending the selected Legendre polynomial bit, in a Legendre code response, to a currently polled Weil code generator.

13. The method of claim 10, wherein generating a Golden code chip comprises:
    generating a shift enable signal and a linear feedback shift register (LFSR) reset signal using at least the code clock, the code phase and the code chip index;
    generating an X1A chip using the shift enable signal, the LFSR reset signal, a register initial value, an LFSR length, and a polynomial in the code parameters;
    generating an X1B chip using the shift enable signal, the LFSR reset signal, the register initial value, the LFSR length, and the polynomial in the code parameters; and
    XORing the X1A chip and the X1B chip to produce the Golden code chip.

14. The method of claim 13, further comprising generating the shift enable signal and the chip reset signal using the code information, comprising:
    counting a number of code clock cycles to produce a counter value; and
    comparing the code chip index with the counter value, and generating a select signal based on the comparison; and
    selecting the shift enable signal among the code clock and a system clock using the select signal.

15. The method of claim 14, wherein generating the shift enable signal and the chip reset signal using the code information further comprises:
    generating a B2a XA reset signal when the code chip index is 8190;
    generating a cycle reset when the code chip counter accumulates to a number of code length; and
    generating an L5 XA reset when the decoder determines that a bit sequence from a first LFSR is 0x7FD.

16. An electronic device, comprising:
    an external system configured to interface with a universal PRN code generator, wherein the external system sets code information and phase control via a register controller, wherein the register controller also stores a current internal code status;

the universal PRN code generator, comprising:
- a digitally controlled oscillator (DCO) configured to receive the phase control information and generate a code clock, a code chip index, and a code phase;
- a primary code generator configured to generate a primary code chip and a secondary code generator configured to generate a secondary code chip, the primary code generator and the secondary code generator each comprising:
  - a Weil code generator configured to generate a Weil code chip using at least:
    - a selected Legendre polynomial bit from a Legendre polynomial distributor;
    - the code clock, the code phase and the code chip index from the DCO; and
    - the code information from the register controller;
  - a memory code generator configured to generate a memory code chip;
  - a Golden code generator configured to generate a Golden code chip using at least:
    - the code clock, the code phase, and the code chip index from the DCO;
    - code parameters in the code information from the register controller; and
  - a first multiplexer configured to select the Weil code chip, the Golden code chip, or the memory code chip as the primary code chip or the secondary code chip;
- a first XOR gate configured to XOR the primary code chip and the secondary code chip to generate a PRN code chip.

17. The electronic device of claim 16, wherein the Weil code generator comprises:
- a Legendre index calculator configured to convert a code chip index to a Legendre index;
- a Legendre index controller configured to:
  - create the Legendre code request that includes the Legendre index;
  - store Legendre code response bits received from the Legendre polynomial distributor in response to the Legendre code request; and
  - output the Legendre code response bits based on the code clock; and
- a second XOR gate configured to XOR the Legendre code response bits to produce the Weil code chip.

18. The electronic device of claim 16, wherein the Golden code generator comprises:
- a Golden code controller configured to generate a shift enable signal and a linear feedback shift register (LFSR) reset signal using at least the code clock, the code phase and the code chip index from the DCO;
- a first LFSR configured to generate an X1A chip using the shift enable signal, the LFSR reset signal from the Golden code controller and a register initial value, an LFSR length, and a polynomial in the code parameters;
- a second LFSR configured to generate an X1B chip using the shift enable signal, the LFSR reset signal from the Golden code controller and the register initial value, the LFSR length, and the polynomial in the code parameters; and
- a third XOR gate configured to XOR the X1A chip and the X1B chip to produce the Golden code chip.

19. The electronic device of claim 18, wherein the Golden code controller is configured to generate the shift enable signal and the chip reset signal using the code information, wherein the Golden code controller comprises:
- a code chip counter configured to count a number of code clock cycles to produce a counter value; and
- a code chip monitor configured to compare the code chip index from the DCO with the counter value from the code chip counter, and generate a select signal based on the comparison; and
- a third multiplexer configured to select the shift enable signal among the code clock from the DCO and a system clock using the select signal from code chip monitor.

20. The electronic device of claim 19,
wherein the code chip counter is further configured to generate a B2a XA reset signal when the code chip index is 8190;
wherein the code chip counter is further configured to generate a cycle reset when the code chip counter accumulates to a number of code length, after which the Golden code generator may reset;
wherein the Golden code controller further comprises a decoder that is configured to generate an L5 XA reset when the decoder determines that a bit sequence from the first LFSR is 0x7FD; and
wherein a fourth multiplexer is configured to select, based on a reset type signal in the code parameters, the B2a XA reset signal, the cycle reset, or the L5 XA reset signal as the LFSR reset signal.

* * * * *